(12) United States Patent
Chen et al.

(10) Patent No.: US 10,879,844 B2
(45) Date of Patent: Dec. 29, 2020

(54) OSCILLATION DEVICE

(71) Applicant: MEDIATEK INC., Hsin-Chu (TW)

(72) Inventors: Wei-Lin Chen, Taipei (TW); Kuan-Ta Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 143 days.

(21) Appl. No.: 15/806,688

(22) Filed: Nov. 8, 2017

(65) Prior Publication Data

US 2018/0152140 A1    May 31, 2018

Related U.S. Application Data

(60) Provisional application No. 62/427,193, filed on Nov. 29, 2016.

(51) Int. Cl.
  *G01R 23/00* (2006.01)
  *H03B 5/20* (2006.01)
  *H03B 5/26* (2006.01)
  *H03B 5/24* (2006.01)

(52) U.S. Cl.
  CPC ............... *H03B 5/20* (2013.01); *H03B 5/24* (2013.01); *H03B 5/26* (2013.01)

(58) Field of Classification Search
  CPC ............... H03B 5/20; H03B 5/26; H03B 5/24
  USPC ............................................ 331/44, 111, 143
  See application file for complete search history.

(56) References Cited

U.S. PATENT DOCUMENTS

| | | | |
|---|---|---|---|
| 4,831,338 A | 5/1989 | Yamaguchi | |
| 5,389,898 A | 2/1995 | Taketoshi et al. | |
| 5,508,664 A | 4/1996 | Rizzo | |
| 5,745,092 A * | 4/1998 | Ito | G09G 3/3681 345/211 |
| 6,052,035 A | 4/2000 | Nolan et al. | |
| 7,061,331 B2 | 6/2006 | Parikh | |
| 8,786,375 B2 * | 7/2014 | Feldtkeller | H03K 3/011 327/185 |
| 8,884,666 B2 | 11/2014 | Passerini et al. | |
| 8,988,157 B2 * | 3/2015 | Tokairin | H03K 4/502 331/1 R |
| 2002/0145478 A1 | 10/2002 | Chang | |
| 2004/0263264 A1 * | 12/2004 | Yin | H03B 5/36 331/57 |
| 2012/0074860 A1 * | 3/2012 | Lee | H05B 45/37 315/240 |
| 2014/0035688 A1 * | 2/2014 | Ko | H03K 3/0231 331/111 |
| 2014/0203879 A1 * | 7/2014 | Kim | H03L 1/022 331/66 |

OTHER PUBLICATIONS

Author: Ravindran Mohanavelu and Payam Heydari; Title: A Novel Ultra High-Speed Flip-Flop Based Frequency Divider; Date: 2004; Publisher: IEEE; Pertinent pp. IV-169 to IV-172 (Year: 2004).*

(Continued)

*Primary Examiner* — Richard Tan (74) *Attorney, Agent, or Firm* — Winston Hsu (57) ABSTRACT

An oscillation device includes an oscillator and a logic circuit. The oscillator generates an output oscillation signal. The logic circuit controls the oscillator according to the output oscillation signal, such that the output oscillation signal includes two different oscillation periods. The oscillation device may be used as a temperature-to-frequency converter without any bandgap reference circuit.

10 Claims, 4 Drawing Sheets

(56) References Cited

OTHER PUBLICATIONS

Wu, C.K., et al.; "A 80kS/s 36μW resistor-based temperature sensor using BGR-free SAR ADC with a unevenly-weighted resistor string in 0.18μm CMOS;" IEEE Symposium on VLSI Circuits Digest of Technical Papers; 2011 pp. 222-223.

Perrott, M., et al.; "A Temperature-to Digital Converter for a MEMS-Based Programmable Oscillator with Better Than ±0.5ppm Frequency Stability;" IEEE International Solid-State Circuits Conference, Session 11; Sensors and MEMs; 2012; pp. 206-208.

Ruffieux, D., et al.; "Silicon Resonator Based 3.2 u W Real Time Clock with ±10 ppm Frequency Accuracy;" IEEE Journal of Solid-State Circuits; vol. 45; No. 1; Jan. 2010; pp. 224-234.

* cited by examiner

OSCILLATION DEVICE

CROSS REFERENCE TO RELATED APPLICATIONS

This application claims the benefit of U.S. Provisional Application No. 62/427,193, filed on Nov. 29, 2016, the entirety of which is incorporated by reference herein.

BACKGROUND OF THE INVENTION

Field of the Invention

The disclosure generally relates to an oscillation device, and more specifically, to an oscillation device used as a temperature-to-frequency converter without any bandgap reference circuit.

Description of the Related Art

Conventionally, the accuracy of a temperature-to-frequency converter is affected by its total circuit delay because the total circuit delay is dependent on the current temperature. In addition, the traditional temperature sensor needs a bandgap reference circuit to provide a temperature-independent bias voltage/current. The routing trace from the bandgap circuit to a sensing component may be too long and cause undesirable coupling and loading effects. Accordingly, there is a need to propose a novel design for solving the aforementioned problems of the prior art.

BRIEF SUMMARY OF THE INVENTION

In a preferred embodiment, the disclosure is directed to an oscillation device including an oscillator and a logic circuit. The oscillator generates an output oscillation signal. The logic circuit controls the oscillator according to the output oscillation signal, such that the output oscillation signal includes two different oscillation periods.

In some embodiments, the oscillator includes an operational amplifier, a first current source, a second current source, and a capacitor. The operational amplifier has a positive input terminal coupled to a first node, a negative input terminal coupled to a second node, and an output terminal for outputting the output oscillation signal. The first current source supplies a first current to the first node. The second current source supplies a second current to the second node. The capacitor is coupled between the first node and a ground voltage.

In some embodiments, the oscillator further includes a current sink and a first switch element. The current sink draws a third current from the first node. The first switch element is coupled between the current sink and the ground voltage. The first switch element is closed or opened according to the output oscillation signal, so as to enable or disable the current sink.

In some embodiments, the oscillator further includes a first resistor. The first resistor is coupled between the second node and a third node.

In some embodiments, the oscillator further includes a second switch element. The second switch element is coupled between the third node and the ground voltage. The second switch element is closed or opened according to a first control signal.

In some embodiments, the third node is coupled to the ground voltage.

In some embodiments, the oscillator further includes a second resistor. The second resistor is coupled between the third node and a fourth node.

In some embodiments, the oscillator further includes a third switch element. The third switch element is coupled between the fourth node and the ground voltage. The third switch element is closed or opened according to a second control signal.

In some embodiments, the fourth node is coupled to the ground voltage.

In some embodiments, the oscillator further includes a third resistor. The third resistor is coupled between the fourth node and the ground voltage.

In some embodiments, the first control signal and the second control signal are generated by the logic circuit according to the output oscillation signal.

In some embodiments, the logic circuit is implemented with a T-latch.

In some embodiments, the logic circuit includes an inverter and a D flip-flop. The inverter has an input terminal for receiving the output oscillation signal, and an output terminal coupled to a fifth node. The D flip-flop has a clock terminal coupled to the fifth node, a data terminal, an output terminal coupled to a sixth node, and an inverted output terminal coupled to a seventh node and fed back to the data terminal.

In some embodiments, the logic circuit further includes a first NOR gate and a second NOR gate. The first NOR gate has a first input terminal coupled to the sixth node, a second input terminal coupled to the fifth node, and an output terminal for outputting the first control signal. The second NOR gate has a first input terminal coupled to the fifth node, a second input terminal coupled to the seventh node, and an output terminal for outputting the second control signal.

In some embodiments, the output oscillation signal includes a first oscillation period and a second oscillation period. The first oscillation period and the second oscillation period have different lengths, and are arranged alternately over the time axis.

In some embodiments, the oscillation device is used as a temperature-to-frequency converter.

In some embodiments, when the oscillation device operates in a test mode, a reference time difference between the first oscillation period and the second oscillation period is measured at a reference temperature. When the oscillation device operates in a normal mode, a modified time difference between the first oscillation period and the second oscillation period is measured at an operation temperature.

In some embodiments, the operation temperature is estimated according to the reference temperature and the ratio of the modified time difference to the reference time difference.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
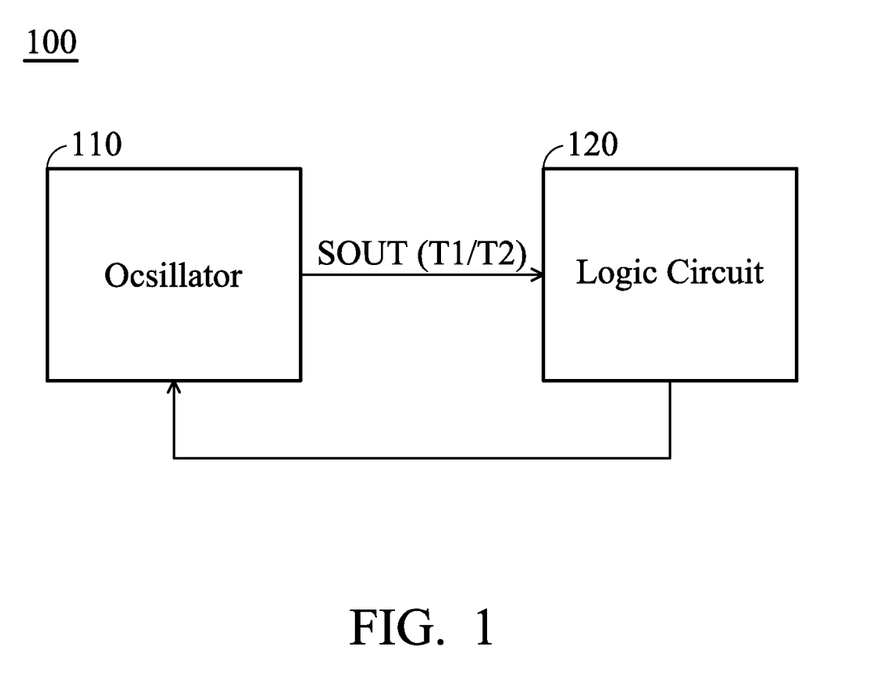
FIG. 1 is a diagram of an oscillation device according to an embodiment of the invention.

FIG. 1 is a diagram of an oscillation device 100 according to an embodiment of the invention. As shown in FIG. 1, the oscillation device 100 includes an oscillator 110 and a logic circuit 120. The oscillator 110 generates an output oscillation signal SOUT. For example, the output oscillation signal SOUT may be a periodic square wave, a periodic triangular wave, or a periodic sine wave. The logic circuit 120 controls the oscillator 110 according to the output oscillation signal SOUT, such that the output oscillation signal SOUT includes two different oscillation periods (T1/T2). In other words, the output oscillation signal SOUT may include two different oscillation frequencies. In some embodiments, the oscillation device 100 is used as a temperature sensor, but it is not limited thereto.

The detailed circuit structure of the proposed oscillation device 100 will be described in the following embodiments. It should be understood that these embodiments and figures are just exemplary, rather than limitations of the invention.

Figure 2:
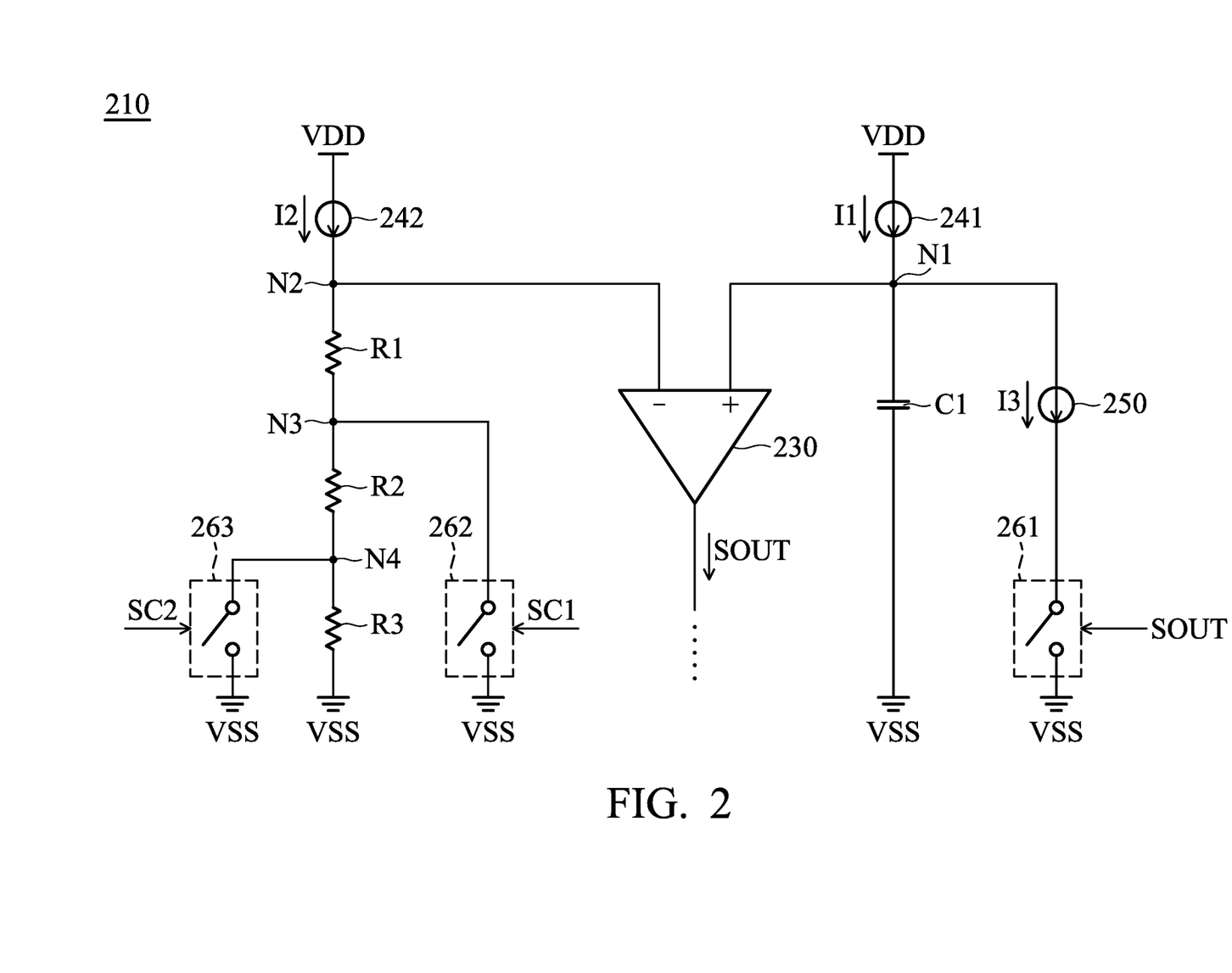
FIG. 2 is a diagram of an oscillator according to an embodiment of the invention.

FIG. 2 is a diagram of an oscillator 210 according to an embodiment of the invention. The oscillator 210 may be applied to the oscillation device 100 of the embodiment of FIG. 1. In the embodiment of FIG. 2, the oscillator 210 includes an operational amplifier (OP) 230, a first current source 241, a second current source 242, a current sink 250, a first switch element 261, a second switch element 262, a third switch element 263, a capacitor C1, a first resistor R1, a second resistor R2, and a third resistor R3. Generally, the oscillator 210 may be a square-wave generator for generating the output oscillation signal SOUT which includes two different oscillation periods.

The operational amplifier 230 has a positive input terminal coupled to a first node N1, a negative input terminal coupled to a second node N2, and an output terminal for outputting the output oscillation signal SOUT. The first current source 241 supplies a first current I1 to the first node N1. The second current source 242 supplies a second current I2 to the second node N2. The capacitor C1 is coupled between the first node N1 and a ground voltage VSS. The current sink 250 draws a third current I3 from the first node N1. The first switch element 261 is coupled between the current sink 250 and the ground voltage VSS. The first switch element 261 is closed or opened according to the output oscillation signal SOUT, so as to enable or disable the current sink 250. For example, if the output oscillation signal SOUT has a high logic level (e.g., a logic "1"), the first switch element 261 will be closed, and the current sink 250 will be enabled; conversely, if the output oscillation signal SOUT has a low logic level (e.g., a logic "0"), the first switch element 261 will be opened, and the current sink 250 will be disabled.

The first resistor R1 is coupled between the second node N2 and a third node N3. The second switch element 262 is coupled between the third node N3 and the ground voltage VSS. The second switch element 262 is closed or opened according to a first control signal SC1. For example, if the first control signal SC1 has a high logic level (e.g., a logic "1"), the second switch element 262 will be closed, and the third node N3 will be directly connected to the ground voltage VSS; conversely, if the first control signal SC1 has a low logic level (e.g., a logic "0"), the second switch element 262 will be opened. In alternative embodiments, the second switch element 262 is removed, and the third node N3 is directly connected to the ground voltage VSS. The second resistor R2 is coupled between the third node N3 and a fourth node N4. The third switch element 263 is coupled between the fourth node N4 and the ground voltage VSS. The third switch element 263 is closed or opened according to a second control signal SC2. For example, if the second control signal SC2 has a high logic level (e.g., a logic "1"), the third switch element 263 will be closed, and the fourth node N4 will be directly connected to the ground voltage VSS; conversely, if the second control signal SC2 has a low logic level (e.g., a logic "0"), the third switch element 263 will be opened. In alternative embodiments, the third switch element 263 is removed, and the fourth node N4 is directly connected to the ground voltage VSS. The third resistor R3 is coupled between the fourth node N4 and the ground voltage VSS. The second switch element 262 and the third switch element 263 are configured to provide three different threshold voltages for the oscillator 210. When both the second switch element 262 and the third switch element 263 are opened, the highest threshold voltage is proportional to the total of the resistances of the first resistor R1, the second resistor R2, and the third resistor R3. When the second switch element 262 is opened and the third switch element 263 is closed, the middle threshold voltage is proportional to the total of the resistances of the first resistor R1 and the second resistor R2. When the second switch element 262 is closed and the third switch element 263 is opened, the lowest threshold voltage is proportional to the resistance of the first resistor R1. With the aforementioned three threshold voltages, the oscillator 210 can generate the output oscillation signal SOUT which includes two different oscillation periods (T1/T2).

Figure 3:
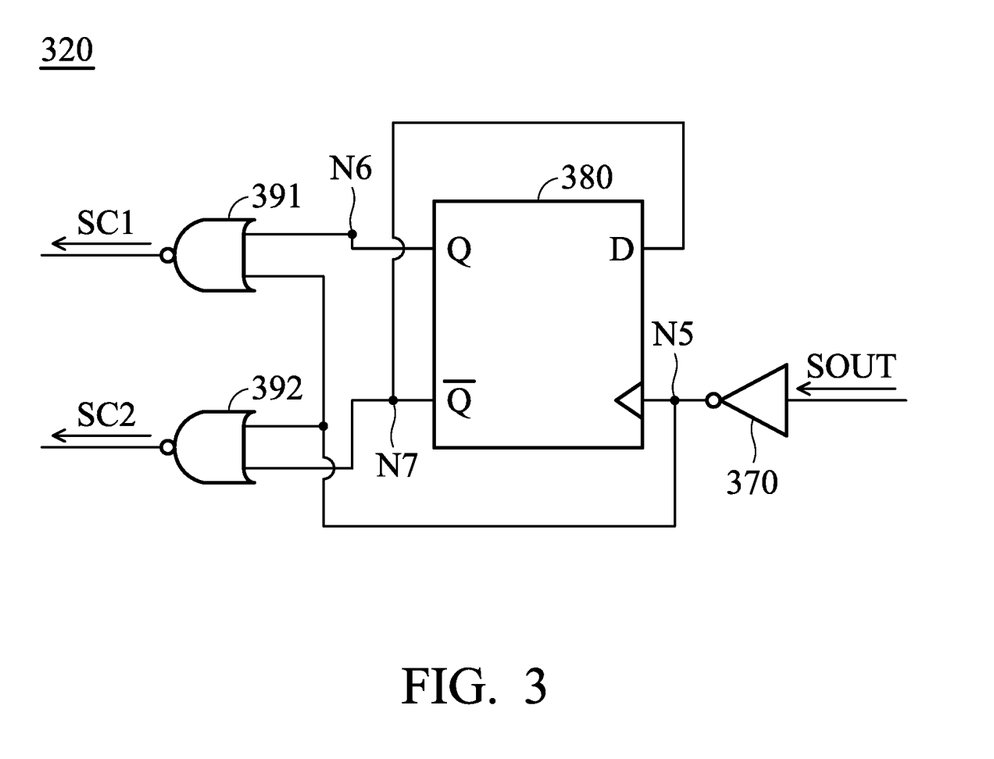
FIG. 3 is a diagram of a logic circuit according to an embodiment of the invention.

FIG. 3 is a diagram of a logic circuit 320 according to an embodiment of the invention. The logic circuit 320 may be applied to the oscillation device 100 of the embodiment of FIG. 1. For example, the logic circuit 320 may be implemented with a T-latch, but it is not limited thereto. In the embodiment of FIG. 3, the logic circuit 320 includes an inverter 370, a D flip-flop 380, a first NOR gate 391, and a second NOR gate 392. Generally, the logic circuit 320 generates the first control signal SC1 and the second control signal SC2 according to the output oscillation signal SOUT, so as to control the oscillator 210 with a negative feedback mechanism.

The inverter 370 has an input terminal for receiving the output oscillation signal SOUT, and an output terminal coupled to a fifth node N5. The D flip-flop 380 has a clock terminal (Triangular Symbol) coupled to the fifth node N5, a data terminal (D), an output terminal (Q) coupled to a sixth node N6, and an inverted output terminal ($\overline{Q}$) coupled to a seventh node N7 and fed back to the data terminal (D). The first NOR gate 391 has a first input terminal coupled to the sixth node N6, a second input terminal coupled to the fifth node N5, and an output terminal for outputting the first control signal SC1. The second NOR gate 392 has a first input terminal coupled to the fifth node N5, a second input terminal coupled to the seventh node N7, and an output terminal for outputting the second control signal SC2.

The relationship between the first control signal SC1, the second control signal SC2, and the output oscillation signal SOUT may be represented by the Boolean equations (1) and (2) as follows:

$$SC1_{N+1} = SOUT \cdot \overline{SC1_N} \qquad (1)$$

$$SC2_{N+1} = SOUT \cdot \overline{SC2_N} \qquad (2)$$

where the symbol $SC1_{N+1}$ represents the logic level of the first control signal SC1 at (N+1)th clock cycle (N is a positive integer), the symbol SOUT represents the logic level of the output oscillation signal SOUT, the symbol $\overline{SC1_N}$ represents the inverse of the logic level of the first control signal SC1 at Nth clock cycle, the symbol $SC2_{N+1}$ represents the logic level of the second control signal SC2 at (N+1)th clock cycle, and the symbol $\overline{SC2_N}$ represents the inverse of the logic level of the second control signal SC2 at Nth clock cycle.

With the aforementioned circuit structure, the logic circuit 320 can divide the output oscillation signal SOUT into the first control signal SC1 and the second control signal SC2. The first control signal SC1 includes a portion of high-logic durations of the output oscillation signal SOUT, and the second control signal SC2 includes the other portion of the high-logic durations of the output oscillation signal SOUT.

Figure 4:
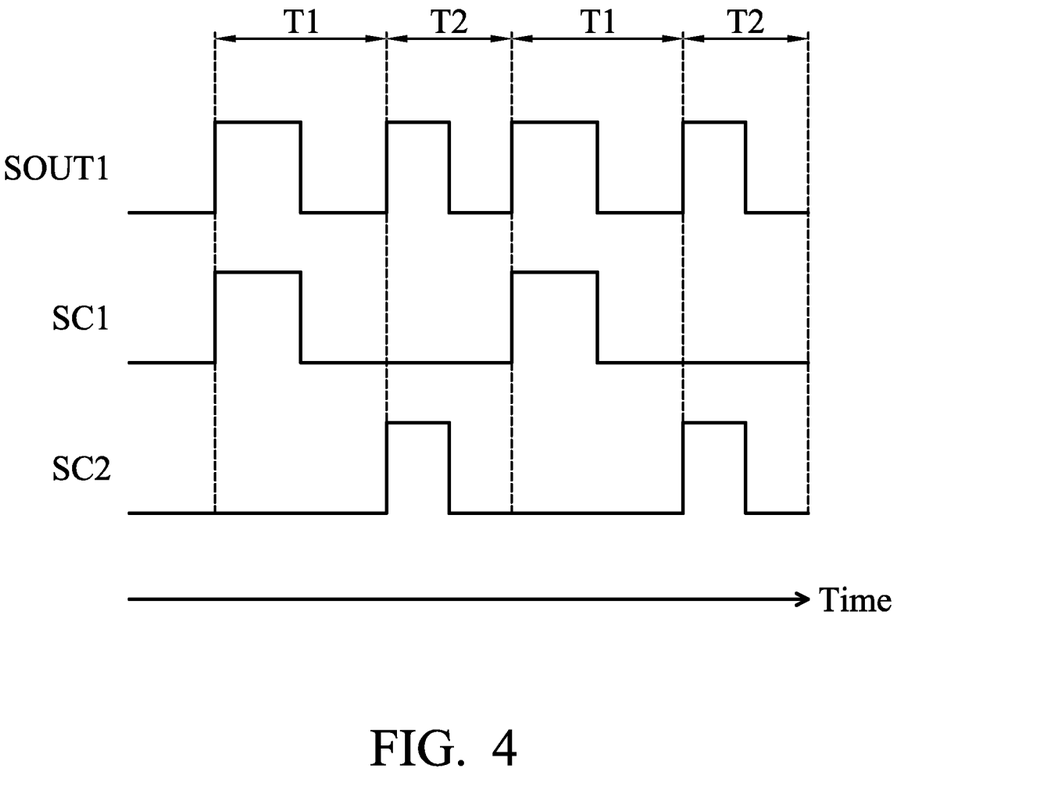
FIG. 4 is a diagram of signal waveforms according to an embodiment of the invention.

FIG. 4 is a diagram of signal waveforms according to an embodiment of the invention. The horizontal axis represents time, and the vertical axis represents voltage level of each signal. Please refer to FIGS. 1 to 4 together. The high-logic durations of the first control signal SC1 and the high-logic durations of the second control signal SC2 are interleaved with each other. The output oscillation signal SOUT includes a first oscillation period T1 and a second oscillation period T2. The first oscillation period T1 and the second oscillation period T2 have different lengths, and they are arranged alternately over the time axis. In alternative embodiments, adjustments are made such that the output oscillation signal SOUT may include multiple continuous first oscillation periods T1 and multiple continuous second oscillation periods T2. For example, two, three, or more first oscillation periods T1 tied together are arranged adjacent to two, three, or more second oscillation periods T2 tied together, without affecting the performance of the invention. The lengths of the first oscillation period T1 and the second oscillation period T2 may be calculated according to equations (3) and (4).

$$T1 = (R2 + R3) \cdot C1 \cdot \left(\frac{I2}{I1} + \frac{I2}{I3 - I1}\right) + D \qquad (3)$$

$$T2 = R3 \cdot C1 \cdot \left(\frac{I2}{I1} + \frac{I2}{I3 - I1}\right) + D \qquad (4)$$

where the symbol T1 represents the length of the first oscillation period T1, the symbol T2 represents the length of the second oscillation period T2, the symbol R2 represents the resistance of the second resistor R2, the symbol R3 represents the resistance of the third resistor R3, the symbol C1 represents the capacitance of the capacitor C1, the symbol I1 represents the magnitude of the first current I1 from the first current source 241, the symbol I2 represents the magnitude of the second current I2 from the second current source 242, the symbol I3 represents the magnitude of the third current I3 to the current sink 250, and the symbol D represents the total circuit delay of the oscillator 210.

As mentioned above, it should be noted that both the first oscillation period T1 and the second oscillation period T2 include the total circuit delay D of the oscillator 210. The total circuit delay D is dominantly determined by the propagation delay of the operational amplifier 230, and the total circuit delay D is dependent on the current temperature. When the oscillation device 100 is configured to detect a temperature, its accuracy may be negatively affected by the total circuit delay D.

Therefore, this embodiment proposes a novel design to use the oscillation device 100 as a highly-accurate temperature-to-frequency converter. The proposed design can cancel the undesired total circuit delay D and provide more accurate detection results. Please refer to the following equations (5), (6), (7), and (8).

$$T1 - T2 = R2 \cdot C1 \cdot \left(\frac{I2}{I1} + \frac{I2}{I3 - I1}\right) \qquad (5)$$

In the beginning, the second oscillation period T2 is subtracted from the first oscillation period T1, and therefore the common total circuit delay D is cancelled. Next, the aforementioned difference (T1−T2) between the first oscillation period T1 and the second oscillation period T2 is measured two times at different temperatures.

$$\frac{T1'' - T2''}{T1' - T2'} = \frac{\Delta TDM}{\Delta TDR} \qquad (6)$$

where the symbol T1' represents the length of the first oscillation period T1 measured at a reference temperature TPR, the symbol T2' represents the length of the second oscillation period T2 measured at the reference temperature TPR, the symbol ΔTDR represents the difference between T1' and T2', the symbol T1" represents the length of the first oscillation period T1 measured at an operation temperature TPO, the symbol T2" represents the length of the second oscillation period T2 measured at the operation temperature TPO, and the symbol ΔTDM represents the difference between T1" and T2".

Specifically, the oscillation device 100 may be operated in either a test mode or a normal mode. When the oscillation device 100 operates in the test mode, the reference time difference ΔTDR between the first oscillation period T1' and the second oscillation period T2' is measured at the reference temperature TPR. When the oscillation device operates in the normal mode, the modified time difference ΔTDM between the first oscillation period T1" and the second oscillation period T2" is measured at the operation temperature TPO.

$$\frac{\Delta TDM}{\Delta TDR} = \frac{R2'' \cdot C1''}{R2' \cdot C1'} \qquad (7)$$

where the symbol R2' represents the resistance of the second resistor R2 measured at the reference temperature TPR, the symbol C1' represents the capacitance of the capacitor C1 measured at the reference temperature TPR, the symbol R2" represents the resistance of the second resistor R2 measured at the operation temperature TPO, and the symbol C1" represents the capacitance of the capacitor C1 measured at the operation temperature TPO.

Since the current ratio $$\left(\text{i.e.,} \left(\frac{I2}{I1} + \frac{I2}{I3-I1}\right)\right)$$

is almost constant and insensitive to variations in temperature, the ratio of the modified time difference ΔTDM to the reference time difference ΔTDR is substantially relative to the impedance values of the second resistor R2 and the capacitor C1, measured at different temperatures. If the current temperature is changed from the reference temperature TPR to the operation temperature TPO, the resistance of the second resistor R2 and the capacitance of the capacitor C1 will be slightly different from their original values (i.e., R2"≠R2', and C1"≠C1'). The reference time difference ΔTDR is proportional to the product of the resistance R2' and the capacitance C1' measured at the reference temperature TPR. The modified time difference ΔTDM is proportional to the product of the resistance R2" and the capacitance C1" measured at the operation temperature TPO.

$$\frac{R2'' \cdot C1''}{R2' \cdot C1'} \approx 1 + (CR1 + CC1) \cdot (TPO - TPR) + \qquad (8)$$

$$(CR2 + CC2 + CR1 \cdot CR2) \cdot (TPO - TPR)^2$$

where the symbol TPR represents the reference temperature TPR, the symbol TPO represents the operation temperature TPO, the symbol CR1 represents a first-order temperature coefficient of the second resistor R2, the symbol CR2 represents a second-order temperature coefficient of the second resistor R2, the symbol CC1 represents a first-order temperature coefficient of the capacitor C1, and the symbol CC2 represents a second-order temperature coefficient of the capacitor C1 (please note that the second-order temperature coefficient CC2 of the capacitor C1 is usually very small and is negligible).

According to equations (4), (5), and (6), the ratio of the modified time difference ΔTDM to the reference time difference ΔTDR is approximately equal to a quadratic polynomial with respect to the temperature difference (TPO-TPR) between the operation temperature TPO and the reference temperature TPR. Because the ratio of the modified time difference ΔTDM to the reference time difference ΔTDR is measurable, the temperature difference (TPO-TPR) can be calculated easily by solving the quadratic equation (6). Finally, the operation temperature TPO can be estimated according to the reference temperature TPR and the ratio of the modified time difference ΔTDM to the reference time difference ΔTDR. In some embodiments, the aforementioned equations (1) to (6) can be solved by a processor and a time-to-digital converter (not shown) related to the oscillation device 100.

In alternative embodiments, adjustments are made such that the resistor R3 is replaced by a short-circuited path, and the third switch element 263 is removed. If the first current I1, the second current I2, and the third current I3 are controlled and adjusted in the test/normal mode, the first oscillation period T1 and the second oscillation period T2 can still have different lengths. That is, the logic circuit 320 may fine-tune the first current I1 from the first current source 241, the second current I2 from the second current source 242, and the third current I3 to the current sink 250, instead of the closing/opening state of the third switch element 263, according to the output oscillation signal SOUT. With such a design, the total circuit delay D can still be cancelled by subtracting the second oscillation period T2 from the first oscillation period T1. Other features of this embodiment are similar to those of the embodiments of FIGS. 1 to 4, and they can achieve similar levels of performance.

It should be noted that the invention is not limited to the above. In alternative embodiments, adjustments are made such that the invention can provide the same function by adjusting the capacitance of the capacitor C1 in a similar way.

The invention proposes a novel oscillation device which can provide two different oscillation periods. When the oscillation device is used as a temperature sensor, it can achieve higher detection accuracy because the non-ideal temperature-dependent circuit delay is completely cancelled by referring to the time difference between the two oscillation periods. In addition, the proposed oscillation device does not need any bandgap circuit for providing a stable voltage, and therefore the chip area and the manufacturing cost of the invention are effectively reduced. To be brief, the invention proposes a highly accurate, bandgap-free, and low-cost oscillation device for use in the field of temperature detection.

Note that the above voltages, currents, resistances, inductances, capacitances and other element parameters are not limitations of the invention. A designer can adjust these parameters according to different requirements. The oscillation device and the temperature-to-frequency converter of the invention are not limited to the configurations of FIGS. 1-4. The invention may merely include any one or more features of any one or more embodiments of FIGS. 1-4. In other words, not all of the features displayed in the figures should be implemented in the oscillation device and the temperature-to-frequency converter.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An oscillation device, comprising:
an oscillator, generating an output oscillation signal; and
a logic circuit, controlling the oscillator according to the output oscillation signal, such that the output oscillation signal comprises two different oscillation periods;
wherein the oscillator comprises:
an operational amplifier, wherein the operational amplifier has a positive input terminal coupled to a first node, a negative input terminal coupled to a second node, and an output terminal for outputting the output oscillation signal;
a first current source, supplying a first current to the first node;
a second current source, supplying a second current to the second node;
a capacitor, coupled between the first node and a ground voltage;
a current sink, drawing a third current from the first node;
a first switch element, coupled between the current sink and the ground voltage, wherein the first switch element is directly controlled by the output oscillation signal, so as to always enable the current sink when the output oscillation signal has one of a high logic level and a low logic level, and always disable the current sink when the output oscillation signal has the other one of the high logic level and the low logic level;
a first resistor, coupled between the second node and a third node;
a second switch element, coupled between the third node and the ground voltage, wherein the second switch element is closed or opened according to a first control signal;
a second resistor, coupled between the third node and a fourth node;
a third switch element, coupled between the fourth node and the ground voltage, wherein the third switch element is closed or opened according to a second control signal; and
wherein the logic circuit comprises:
an inverter, wherein the inverter has an input terminal for receiving the output oscillation signal, and an output terminal coupled to a fifth node; and
a D flip-flop, wherein the D flip-flop has a clock terminal coupled to the fifth node, a data terminal, an output terminal coupled to a sixth node, and an inverted output terminal coupled to a seventh node and fed back to the data terminal.

2. The oscillation device as claimed in claim 1, wherein the fourth node is coupled to the ground voltage.

3. The oscillation device as claimed in claim 1, wherein the oscillator further comprises:
a third resistor, coupled between the fourth node and the ground voltage.

4. The oscillation device as claimed in claim 1, wherein the first control signal and the second control signal are generated by the logic circuit according to the output oscillation signal.

5. The oscillation device as claimed in claim 1, wherein the logic circuit further comprises:
a first NOR gate, wherein the first NOR gate has a first input terminal coupled to the sixth node, a second input terminal coupled to the fifth node, and an output terminal for outputting the first control signal; and
a second NOR gate, wherein the second NOR gate has a first input terminal coupled to the fifth node, a second input terminal coupled to the seventh node, and an output terminal for outputting the second control signal.

6. The oscillation device as claimed in claim 1, wherein the logic circuit only uses the output oscillation signal generated by the oscillator, without using any other oscillation signal, to generate control signals to control the oscillator to generate the output oscillation signal comprising two different oscillation periods.

7. An oscillation device, comprising:
an oscillator, generating an output oscillation signal; and
a logic circuit, controlling the oscillator according to the output oscillation signal, such that the output oscillation signal comprises two different oscillation periods;
wherein the oscillator comprises:
an operational amplifier, wherein the operational amplifier has a positive input terminal coupled to a first node, a negative input terminal coupled to a second node, and an output terminal for outputting the output oscillation signal;
a first current source, supplying a first current to the first node;
a second current source, supplying a second current to the second node;
a capacitor, coupled between the first node and a ground voltage;
a current sink, drawing a third current from the first node; and
a first switch element, coupled between the current sink and the ground voltage, wherein the first switch element is directly controlled by the output oscillation signal, so as to always enable the current sink when the output oscillation signal has one of a high logic level and a low logic level, and always disable the current sink when the output oscillation signal has the other one of the high logic level and the low logic level;
wherein the output oscillation signal comprises a first oscillation period and a second oscillation period which have different lengths and are arranged alternately over time axis.

8. The oscillation device as claimed in claim 7, wherein the oscillation device is used as a temperature-to-frequency converter.

9. The oscillation device as claimed in claim 7, wherein when the oscillation device operates in a test mode, a reference time difference between the first oscillation period and the second oscillation period is measured at a reference temperature, and wherein when the oscillation device operates in a normal mode, a modified time difference between the first oscillation period and the second oscillation period is measured at an operation temperature.

10. An oscillation device, comprising:
an oscillator, generating an output oscillation signal; and
a logic circuit, controlling the oscillator according to the output oscillation signal, such that the output oscillation signal comprises two different oscillation periods;
wherein the output oscillation signal comprises a first oscillation period and a second oscillation period which have different lengths and are arranged alternately over time axis;
wherein when the oscillation device operates in a test mode, a reference time difference between the first oscillation period and the second oscillation period is measured at a reference temperature, and wherein when the oscillation device operates in a normal mode, a modified time difference between the first oscillation period and the second oscillation period is measured at an operation temperature; and the operation temperature is estimated according to the reference temperature and a ratio of the modified time difference to the reference time difference.

\* \* \* \* \*